(12) United States Patent
Samukawa

(10) Patent No.: US 7,144,817 B2
(45) Date of Patent: Dec. 5, 2006

(54) ETCHING SOLUTIONS AND PROCESSES FOR MANUFACTURING FLEXIBLE WIRING BOARDS

(75) Inventor: Hiroshi Samukawa, Kanuma (JP)

(73) Assignees: Sony Corporation, Tokyo (JP), part interest; Sony Chemicals Corp., Tokyo (JP), part interest (*) Notice: Subject to any disclaimer, the term of this patent is extended or adjusted under 35 U.S.C. 154(b) by 438 days.

(21) Appl. No.: 09/905,052

(22) Filed: Jul. 12, 2001

(65) Prior Publication Data

US 2002/0030178 A1 Mar. 14, 2002

(30) Foreign Application Priority Data

Jul. 12, 2000 (JP) .............................. 2000-210918

(51) Int. Cl.
*H01L 21/302* (2006.01)
*C09K 13/00* (2006.01)

(52) U.S. Cl. .................... 438/698; 438/745; 252/79.1; 252/79.4

(58) Field of Classification Search ............... 438/745, 438/689, 698; 252/79.1, 79.4
See application file for complete search history.

(56) References Cited

U.S. PATENT DOCUMENTS

| | | | | |
|---|---|---|---|---|
| 4,369,090 A | * | 1/1983 | Wilson et al. ................. 216/83 |
| 4,426,253 A | | 1/1984 | Kreuz et al. ................. 156/668 |
| 4,473,523 A | * | 9/1984 | Sasaki et al. ............. 264/211.2 |
| 5,004,777 A | * | 4/1991 | Hallden-Abberton et al. ............................ 524/433 |
| 5,157,055 A | * | 10/1992 | Akagi et al. ................... 521/25 |
| 5,322,976 A | * | 6/1994 | Knudsen et al. ............. 174/262 |
| 5,441,770 A | * | 8/1995 | Rychwalski et al. ........ 427/306 |
| 5,441,815 A | * | 8/1995 | Li et al. ................... 428/473.5 |
| 6,218,022 B1 | * | 4/2001 | Suzuki et al. ............... 428/457 |
| 6,233,821 B1 | * | 5/2001 | Takahashi et al. ............ 29/847 |
| 2002/0030178 A1 | * | 3/2002 | Samukawa .................. 252/791 |

FOREIGN PATENT DOCUMENTS

| | | |
|---|---|---|
| CN | 1170474 A | 1/1998 |
| CN | 1177751 A | 4/1998 |
| CN | 1258187 A | 6/2000 |
| JP | 58-103531 | 6/1983 |
| JP | 6-234870 | 8/1994 |
| JP | 11-209754 | 8/1999 |

OTHER PUBLICATIONS

First Office Action from the Patent Office of the People's Republic of China dated Apr. 16, 2004 (3 pages).
Patent Abstracts of Japan No. 11-209754 dated Aug. 3, 1999 (1 page).
Patent Abstracts of Japan No.: 06-234870 dated Aug. 23, 1994 (1 page).

* cited by examiner

*Primary Examiner*—Nadine G. Norton
*Assistant Examiner*—Lynette T. Umez-Eoninin
(74) *Attorney, Agent, or Firm*—Osha Liang LLP

(57) ABSTRACT

The disclosure relates to methods and solutions for precisely and rapidly etching a polyimide resin layer. Etching solutions of the present invention include 3–65% by weight of a diol containing 3 to 6 carbon atoms or a triol containing 4 to 6 carbon atoms, 10–55 % by weight of an alkali compound and water in an amount of 0.75–3.0 times the amount of the alkali compound, and can be used at 65° C. or more to rapidly etch a polyimide resin layer having an imidation degree of 50–98 % without unfavorably affecting the working atmosphere. Even if the resin layer is completely imidated after etching, the etching pattern of the resulting resin layer is not deformed with a decreased contamination by impurity ions as compared with those obtained using conventional etching solutions.

20 Claims, 5 Drawing Sheets

ETCHING SOLUTIONS AND PROCESSES FOR MANUFACTURING FLEXIBLE WIRING BOARDS

FIELD OF THE INVENTION

The present invention relates to the technique for wiring boards, particularly to a technique for forming an opening in a resin layer on the surface of a metal wiring of a flexible wiring board.

PRIOR ART

Wiring boards having a metal wiring and a resin layer to form flexible wiring boards have been widely used in the field of electronic apparatus.

A process for manufacturing such a flexible wiring board is explained with reference to FIG. 8(a)–(e).

Reference numeral 115 in FIG. 8(a) represents a metal wiring, and a base film 111 is applied on the surface of this metal wiring 115.

Opposite to the side of this metal wiring 115 on which base film 111 is applied, a coating solution containing a polyimide precursor polyamic acid is applied and dried to form a precursor layer 122 based on the polyamic acid (FIG. 8(b)).

Then, the assembly is heated to imidate the polyamic acid contained in precursor layer 122.

Reference numeral 123 in FIG. 8(c) represents a resin layer consisting of the polyimide formed by imidating precursor layer 122.

Then, a resist coating solution is applied on the surface of resin layer 123 in this state, and the resin layer 123 is exposed and developed to form an alkali-resistant resist layer patterned in a predetermined shape.

Reference numeral 125 in FIG. 8(d) represents a resist layer patterned using the above process. This resist layer 125 has an opening 130 formed by patterning, and resin layer 123 is exposed at the bottom of this opening 130.

Then, the assembly is immersed into an etching solution to remove resin layer 123 exposed at the bottom of opening 130 (etching). When resin layer 123 is removed and metal wiring 115 is exposed at the bottom of opening 130, the assembly is removed from the etching solution and the etching solution is washed off the assembly with warmed water and then resist layer 125 is separated to give a flexible wiring board shown by reference numeral 110 in FIG. 8(e).

Resin layer 123 formed on the surface of this flexible wiring board 110 has openings 130 at the bottom of which is exposed metal wiring 115.

When bumps of another flexible wiring board are brought into contact with metal wiring 115 via such openings 130, both flexible wiring boards are electrically connected into a flexible wiring board of multilayer structure.

Known etching solutions used for the process of etching resin layer 123 include those containing an alkali metal, a hydrazine alkali metal, ethanolamine and water as disclosed in JPA 97081/1998 and those containing an alkali metal, an alcohol, an amine and water as disclosed in JPA 195214/1998.

These etching solutions are very good for dissolving polyimides, but when such etching solutions are heated to increase etching speed, highly toxic organic solvents such as hydrazine or amines evaporate to unfavorably affect the working atmosphere.

Amine-free solutions consisting of an alkali compound such as tetramethylammonium hydroxide dissolved in a lower alcohol such as ethanol, n-propanol or isopropanol have been proposed (JPA 103531/1983).

However, these lower alcohols have high volatility and flammability so that they also unfavorably affect the working atmosphere in the same manner as amines.

Aqueous tetramethylammonium hydroxide solutions are known as low-toxicity etching solutions, but cannot serve to etch cured polyimide resin layers because of their limited ability to dissolve polyimides.

Such low-dissolving etching solutions may be used by applying and drying a raw resin solution based on a polyamic acid to form a polyimide precursor layer having an imidation degree of 8–15% and then etching said polyimide precursor layer.

In this case, however, the polyimide precursor layer is patterned by etching and then imidated by heat treatment with the result that the patterned polyimide precursor layer is contracted during the heat treatment to lower the precision of the pattern.

An amine is sometimes added to such low-dissolving etching solutions to shorten the time for etching the polyimide precursor layer, but the amine coordinates with the polar group of the polyamic acid in the polyimide precursor layer and remains in the polyimide precursor layer even after the post-etching washing process.

If the polyimide precursor layer is calcined in this state, a highly toxic gas such as amine gas or amine decomposition product gas is generated to unfavorably affect the working atmosphere. Moreover, ion contamination of the final flexible wiring board is aggravated by the ammonium ion, which may be generated from an amine decomposition product and remaining in the polyimide resin layer formed by imidation.

What is needed, therefore, is a method an solution for rapidly and precisely etching resin layers without using a highly toxic solvent in order to overcome the disadvantages of the prior art as described above.

SUMMARY OF THE INVENTION

Throughout the specification, the phrase "imidation degree" is used. The meaning is described below.

Reference numeral 50 in FIG. 3(a) represents a polyimide precursor polyamic acid, and said polyamic acid 50 is dehydrated to ring closure by heating or other means (imidation) into a polyimide.

Reference numeral 55 in FIG. 3(b) represents the polyimide formed by imidating the polyamic-acid, and said polyimide 55 has benzene rings 51 and cyclic imides 53. On the contrary, polyamic acid 50 has benzene rings 51 without cyclic imides as shown in FIG. 3(a).

The specification measures the difference in structure between these polyamic acid 50 and polyimide 55 by defining the extent of imidation (imidation degree) of polyimide in the present invention by equation (1) below.

$$\text{Imidation degree (\%)} = (PS_{1770}/PS_{1500})/(PI_{1770}/PI_{1500}) \times 100 \quad (1)$$

where $PI_{1770}$, $PS_{1770}$, $PI_{1500}$ and $PS_{1500}$ represent absorption intensities measured by a Fourier transform infrared spectrophotometer at wavelengths of 1770 cm$^{-1}$ and 1500 cm$^{-1}$, and specifically $PS_{1770}$ and $PS_{1500}$ represent the absorption intensities of a polyimide sample under test at wavelengths of 1770 cm$^{-1}$ and 1500 cm$^{-1}$ while $PI_{1770}$ and $PI_{1500}$ represent the absorption intensities of said polyimide sample completely imidated (imidation degree 100%) at wavelengths of 1770 cm$^{-1}$ and 1500 cm$^{-1}$.

In the present invention, polyimide samples calcined at 350° C. for 15 minutes are defined as having an imidation degree of 100%.

As the infrared absorption at these wavelengths 1770 cm$^{-1}$ and 1500 cm$^{-1}$ results from the skeletal vibration of cyclic imide and benzene ring, the content of cyclic imide or the extent of imidation of polyimide in a polyimide sample can be numerically expressed by substituting the ratio of absorption intensities at these wavelengths in the polyimide sample ($PS_{1770}/PS_{1500}$) and the ratio of absorption intensities at these wavelengths in the polyimide sample completely imidated ($PI_{1770}/PI_{1500}$) into equation (1) above.

As used herein, the term polyimide implies not only completely imidated polyimides but also those containing a polyimide precursor represented by a polyamic acid.

In one aspect, the present invention provides an etching solution suitable for etching a resin layer based on a polyimide, the solution comprising an alcohol, water and an alkali compound, wherein the alcohol is present in a range of from 3 to 65% by weight, the alkali compound is present in a range of from 10 to 55% by weight and the water is present in a range of from 0.75 to 3.0 times a weight of the alkali compound, and wherein the alcohol is based on either one or both of a diol containing from 3 to 6 carbon atoms and a triol containing from 4 to 6 carbon atoms and the alkali compound is based on either one or both of an alkali metal hydroxide and a quaternary ammonium hydroxide.

In another aspect, the present invention provides an etching solution suitable for etching a resin layer based on a polyimide, the solution comprising an alcohol, water and an alkali compound, wherein the alcohol is present in a range of from 3 to 65% by weight, the alkali compound is present in a range of from 10 to 55% by weight and the water is present in a range of from 0.85 to 2.5 times a weight of the alkali compound, and wherein the alcohol is based on either one or both of a diol containing from 3 to 6 carbon atoms and a triol containing from 4 to 6 carbon atoms and the alkali compound is based on either one or both of an alkali metal hydroxide and a quaternary ammonium hydroxide.

In another aspect, the present invention provides the etching solution, wherein the alkali metal hydroxide is based on at least one compound selected from a group consisting of sodium hydroxide, potassium hydroxide and lithium hydroxide.

In another aspect, the present invention provides the etching solution, wherein the quaternary ammonium hydroxide is based on either one or both of tetramethylammonium hydroxide and tetraethylammonium hydroxide.

In another aspect, the present invention provides the etching solution, wherein the diol is based on at least one diol selected from a group consisting of 1,3-propanediol, 2,3-butanediol, 1,4-butanediol and 1,5-pentanediol.

In another aspect, the present invention provides a process for etching a resin layer, comprising the steps of forming a film-like resin layer based on a polyimide having an imidation degree of from 50 to 98%, providing a resist layer having an opening at a desired position on a surface of the resin layer, and bringing an etching solution at 65° C. or more into contact with the resin layer located at a bottom of the opening to etch the resin layer, the etching solution comprising an alcohol of from 3 to 65% by weight, an alkali compound of from 10 to 55% by weight and water in a weight of 0.75 to 3.0 times a weight of the alkali compound wherein the alcohol is based on either one or both of a diol containing from 3 to 6 carbon atoms and a triol containing from 4 to 6 carbon atoms and the alkali compound is based on either one or both of an alkali metal hydroxide and a quaternary ammonium hydroxide.

In another aspect, the present invention provides a process for etching a resin layer, comprising the steps of forming a film-like resin layer based on a polyimide having an imidation degree of from 50 to 98%, providing a resist layer having an opening at a desired position on the surface of the resin layer, and bringing an etching solution at 65° C. or more into contact with the resin layer located at a bottom of the opening to etch the resin layer, the etching solution comprising an alcohol of from 3 to 65% by weight, an alkali compound of from 10 to 55% by weight and water in a weight of from 0.85 to 2.5 times the weight of the alkali compound wherein the alcohol is based on either one or both of a diol containing from 3 to 6 carbon atoms and a triol containing from 4 to 6 carbon atoms and the alkali compound is based on either one or both of an alkali metal hydroxide and a quaternary ammonium hydroxide.

In another aspect, the present invention provides the process for etching a resin layer, wherein the step of forming a film-like resin layer comprises the step of heating a precursor layer based on a polyimide resin having an imidation degree of less than 50%.

In another aspect, the present invention provides the process for etching a resin layer, wherein the step of forming a film-like resin layer comprises the step of applying and drying a coating solution containing a polyimide having an imidation degree of from 50 to 98% on a substrate.

In another aspect, the present invention provides a process for manufacturing a flexible wiring board comprising the steps of applying and drying a coating solution containing a polyimide precursor on a side of a substrate having at least a metal wiring on which the metal wiring is provided to form a precursor layer based on a polyimide having an imidation degree of less than 50%, heating the precursor layer to form a polyimide resin layer having an imidation degree of from 50 to 98%, applying and drying a resist layer coating solution on a surface of the resin layer to form a resist layer, patterning the resist layer in a desired shape to form an opening, preparing an etching solution comprising an alcohol of from 3 to 65% by weight, an alkali compound from 10 to 55% by weight and water in a weight of from 0.75 to 3.0 times a weight of the alkali compound wherein the alcohol is based on either one or both of a dial containing from 3 to 6 carbon atoms and a triol containing from 4 to 6 carbon atoms and the alkali compound is based on either one or both of an alkali metal hydroxide and a quaternary ammonium hydroxide, and bringing the etching solution at 65° C. or more into contact with the resin layer located at a bottom of the opening to etch the resin layer.

In another aspect, the present invention provides a process for manufacturing a flexible wiring board comprising the steps of applying and drying a coating solution containing a polyimide precursor on a surface of a metal foil to form a precursor layer based on a polyimide having an imidation degree of less than 50%, heating the precursor layer to form a polyimide resin layer having an imidation degree of from 50 to 98%, applying and drying a resist layer coating solution on the surface of the resin layer to form a resist layer, patterning the resist layer in a desired shape to form an opening, preparing an etching solution comprising an alcohol from 3 to 65% by weight, an alkali compound from 10 to 55% by weight and water in a weight of from 0.75 to 3.0 times the weight of the alkali compound wherein the alcohol is based on either one or both of a dial containing from 3 to 6 carbon atoms and a triol containing from 4 to 6 carbon atoms and the alkali compound is based on either one or both of an alkali metal hydroxide and a quaternary ammonium hydroxide, bringing the etching solution at 65° C. or more into contact with the resin layer located at a bottom of the opening to etch the resin layer, and providing a resist layer having an opening at a desired position on the opposite side to a side of the metal foil on which the resin layer is formed to remove the metal foil exposed at the bottom of the opening in the resist layer.

In another aspect, the present invention provides a process for manufacturing a flexible wiring board comprising the steps of applying and drying a coating solution containing a polyimide having an imidation degree of from 50 to 98% on the side of a substrate having at least a metal wiring on which the metal wiring is provided to form a resin layer, applying and drying a resist layer coating solution on a surface of the resin layer to form a resist layer, patterning the resist layer in a desired shape to form an opening, preparing an etching solution comprising an alcohol of from 3 to 65% by weight, an alkali compound of from 10 to 55% by weight and water in a weight of from 0.75 to 3.0 times a weight of the alkali compound wherein the alcohol is based on either one or both of a diol containing from 3 to 6 carbon atoms and a triol containing from 4 to 6 carbon atoms and the alkali compound is based on either one or both of an alkali metal hydroxide and a quaternary ammonium hydroxide, and bringing the etching solution at 65° C. or more into contact with the resin layer located at a bottom of the opening to etch the resin layer.

In another aspect, the present invention provides a process for manufacturing a flexible wiring board comprising the steps of applying and drying a coating solution containing a polyimide having an imidation degree of from 50 to 98% on a surface of a metal foil to form a resin layer, applying and drying a resist layer coating solution on a surface of the resin layer to form a resist layer, patterning the resist layer in a desired shape to form an opening, preparing an etching solution comprising an alcohol of from 3 to 65% by weight, an alkali compound of from 10 to 55% by weight and water in a weight of from 0.75 to 3.0 times a weight of the alkali compound wherein the alcohol is based on either one or both of a diol containing from 3 to 6 carbon atoms and a triol containing from 4 to 6 carbon atoms and the alkali compound is based on either one or both of an alkali metal hydroxide and a quaternary ammonium hydroxide, bringing the etching solution at 65° C. or more into contact with the resin layer located at the bottom of the opening to etch the resin layer, and providing a resist layer having an opening at a desired position on the opposite side to a side of the metal foil on which the resin layer is formed to remove the metal foil exposed at a bottom of the opening in the resist layer.

DETAILED DESCRIPTION

EXAMPLE 1

In the first embodiment, etching solutions of the present invention and an example of process for manufacturing a flexible wiring board of the present invention are described with reference to FIG. 1(a)–(i).

Figure 1A:
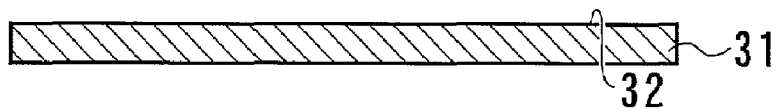
FIG. 1(a)–(i) is a flow sheet illustrating a process for manufacturing a first example of flexible wiring board of the present invention.

Reference numeral 31 in FIG. 1(a) represents a metal foil. On at least one surface of this metal foil 31, a rough surface (matte surface) 32 is formed by roughening.

A polyamic acid consisting of biphenyltetracarboxylic acid and two aromatic diamines (p-phenylenediamine and 4,4'-diaminodiphenyl ether) is dissolved in N-methylpyrrolidone (hereinafter abbreviated as NMP) to prepare a polyamic acid coating solution containing 15% by weight of the polyamic acid.

Figure 1B:
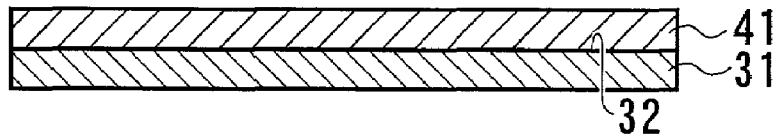

This polyamic acid coating solution is first applied on the rough surface 32 of metal foil 31 shown in FIG. 1(a) and then is heated to dryness in a drying oven at 100° C. for 4 minutes to form a precursor layer 41 (FIG. 1(b)).

Then, the assembly is calcined at 160° C. for 3 minutes to imidate the polyamic acid contained in precursor layer 41.

Figure 1C:
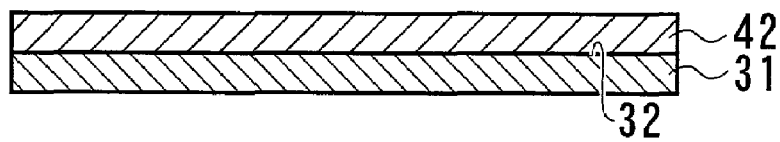

Reference numeral 42 in FIG. 1(c) represents a resin layer 42 obtained by imidating precursor layer 41.

The ratio of absorption intensities ($PI_{1770}/PI_{1500}$) of resin layer 42 in the state shown in FIG. 1(c) determined by Fourier transform infrared spectroscopy was 0.27.

Separately, the precursor layer 41 in the state shown in FIG. 1(b) is calcined at 350° C. for 15 minutes into a completely imidated resin layer. The ratio of absorption intensities ($PS_{1770}/PS_{1500}$) of this precursor layer determined by Fourier transform infrared spectroscopy was 0.45.

These values of ratios ($PS1770/PS_{1500}$ and $PI_{1770}/P_{1500}$) were substituted into equation (1) above to determine the imidation degree of resin layer 42 in the state shown in FIG. 1(c) to be 60%. The thickness of resin layer 42 here was about 22 μm.

Again separately, the ratio of absorption intensities of precursor layer 41 in the state shown in FIG. 1(b) were determined by the same method as described above to be 0.07, from which the imidation degree was calculated as about 15%.

Figure 1D:
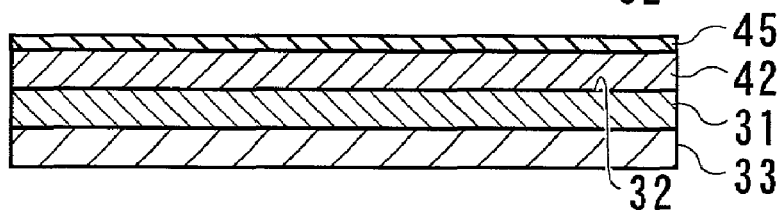

A carrier film 33 is then applied on the surface of the side of metal foil 31 in the state shown in FIG. 1(c) on which resin layer 42 is not formed, and a resist layer coating solution is applied on the surface of resin layer 42 to form a resist layer 45 (FIG. 1(d)).

Then, the resist layer 45 is patterned by exposure and development through two negative patterns in the form of a circle having a diameter of 75 μm and a square having a side of 100 μm, respectively, to form 14 openings having different shapes and bottom sizes.

Reference numeral 49 in FIG. 1(*e*) represents an opening 49 formed in resist layer 45 by patterning, and resin layer 42 is exposed at the bottom of said opening 49.

Then, 33 parts by weight of 1,3-propanediol as an alcohol is added to a mixture of 33 parts by weight of high-purity potassium hydroxide available from Wako Pure Chemical Industries Ltd. as an alkali compound and 34 parts by weight of pure water to prepare an amine-free etching solution.

Then, said etching solution is warmed to 65° C., and resin layer 42 in the state shown in FIG. 1(*e*) is wholly immersed in said etching solution and maintained at a temperature of 65° C. with gentle stirring to remove resin layer 42 exposed at the bottom of opening 49 in resist layer 45.

When resin layer 42 at the bottom of opening 49 is removed and metal foil 31 is exposed at the bottom of opening 49 as shown in FIG. 1(*f*), the assembly is removed from the etching solution and washed with warm water at 60° C.

Then, resist layer 45 and carrier film 33 are separated (FIG. 1(*g*)) and the assembly is heated at 350° C. for 15 minutes to completely imidate the polyimide in resin layer 42.

Reference numeral 43 in FIG. 1(*h*) represents the resin layer completely imidated. Then, a resist layer patterned in a desired shape is formed on the surface of metal foil 31 on which resin layer 43 is not formed, and metal foil 31 exposed at the bottom of the opening in this resist layer is etched to pattern metal foil 31.

FIG. 1(*h*) shows the state in which metal foil 31 has been patterned and the resist layer used for this patterning has been separated, and reference numeral 35 in the same figure represents a metal wiring obtained by patterning metal foil 31.

Then, a base film coating solution is applied and dried on the surface of metal wiring 35 on which resin layer 43 is not formed to form a base film 40. Reference numeral 30 in FIG. 1(*i*) represents a first example of flexible wiring board of the present invention having base film 40.

This flexible wiring board 30 has opening 49 in resin layer 43, and metal wiring 35 is exposed at the bottom of this opening 49.

During the process in which said flexible wiring board 30 was formed, the "etching speed" and "appearance evaluation" tests described below were performed.

[Etching Speed]

The time (minutes) required for etching resin layer 42 shown in FIG. 1(*e*)–(*f*) was determined.

[Appearance Evaluation]

The appearance of completely imidated resin layer 43 in the state shown in FIG. 1(*h*) as described above was observed under an optical microscope at a magnification of 200.

Here, the appearance of each opening 49 in resin layer 42 formed with a negative pattern in the form of a circle having a diameter of 75 μm and a negative pattern in the form of a square having a side of 100 μm was observed and evaluated as follows. If any of these openings 49 falls under any of the following conditions 1) to 3), the appearance was assessed as "poor". If none of openings 49 falls under any of these conditions, the appearance was assessed as "good". 1) The diameter or side at the bottom of opening 49 in resin layer 42 is a half or less of the diameter or side of each negative pattern. 2) Opening 49 is deformed. 3) A complete opening was not formed.

The results of these measurement and evaluation are shown as Example 1 in Table 1 below.

TABLE 1

| | Solvent for etching solution | imidation degree (%) | Solution temperature | Etching speed (min.) | Appearance |
|---|---|---|---|---|---|
| Example 1 | 1,3-Propanediol | 60 | 65° C. | 2.2 | good |
| Example 2 | | | 75° C. | 1.8 | good |
| Example 3 | | 80 | 65° C. | 8.2 | good |
| Example 4 | | | 75° C. | 4.1 | good |
| Example 5 | | | 85° C. | 2.2 | good |
| Comparative example 1 | | 100 | 85° C. | 13.0 | good |
| Example 6 | 1,4-Butanediol | 60 | 65° C. | 1.7 | good |
| Example 7 | | | 75° C. | 1.2 | good |
| Example 8 | | 80 | 65° C. | 8.4 | good |
| Example 9 | | | 75° C. | 4.0 | good |
| Example 10 | | | 85° C. | 2.2 | good |
| Comparative example 2 | | 100 | 85° C. | 12.0 | good |
| Comparative example 3 | Ethylene glycol | 80 | 75° C. | 7.0 | poor |
| Comparative example 4 | | 100 | 85° C. | >25.0 | poor |

EXAMPLE 2

The same resin layer 42 as used in Example 1 having a patterned resist layer 45 in the state shown in FIG. 1(*e*) was immersed into the same etching solution as used in Example 1 at 75° C. to etch resin layer 42 under the same conditions as in Example 1 and subjected to the "etching speed" test. Then, etched resin layer 42 was washed, and resist layer 45 and carrier film 33 were separated and resin layer 42 was completely imidated under the same conditions as in Example 1.

Resin layer 43 obtained by complete imidation of resin layer 42 was subjected to the "appearance evaluation" test under the same conditions as in Example 1.

The results of these "etching speed" and "appearance evaluation" tests are shown as Example 2 in Table 1 above.

EXAMPLES 3–5

Precursor layer 41 shown in FIG. 1(*b*) was calcined under the same conditions as in Example 1 and calcined again at 20° C. for 3 minutes to form resin layer 42 in the state shown in FIG. 1(*c*).

The imidation degree of the polyimide in resin layer 42 in this state was determined under the same conditions as in Example 1 to be about 80%. The film thickness was about 19 μm.

Then, a patterned resist layer 45 was formed on the surface of this resin layer 42 by the same process as in Example 1.

Resin layer 42 in this state was immersed in each of three etching solutions (the same etching solution as used in Example 1 kept at 65° C., 75° C. and 85° C.) and subjected to the "etching speed" test under the same conditions as in Example 1.

After completion of etching, etched resin layer 42 was washed, resist layer 45 and carrier film 33 were separated and resin layer 42 was completely imidated under the same conditions as in Example 1.

Resin layer 43 obtained by complete imidation of resin layer 42 was subjected to the "appearance evaluation" test under the same conditions as in Example 1.

The results of these "etching speed" and "appearance evaluation" tests with etching solutions at different temperatures are shown as Examples 3–5 in Table 1 above.

EXAMPLES 6, 7

An etching solution was prepared in the same manner as in Example 1 except that 1,4-butanediol was used as an alcohol in place of 1,3-propanediol used in Example 1 and mixed with the same water and potassium hydroxide in the same weight ratio as used in Example 1.

Figure 1E:
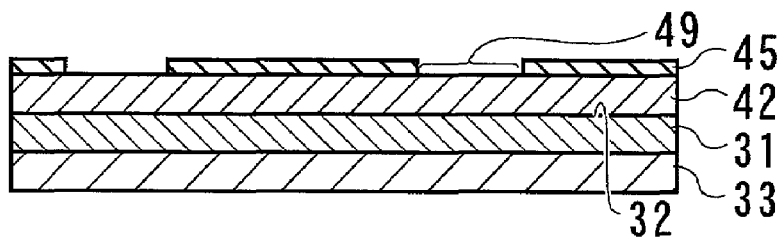
Figure 1F:
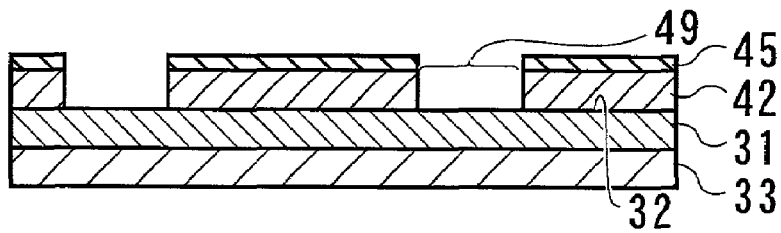
Figure 1G:
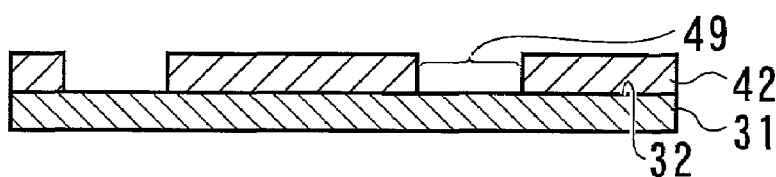
Figure 1H:
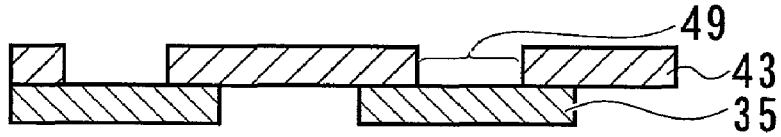

The same resin layer 42 as used in Example 1 in the state shown in FIG. 1(e) was immersed in said etching solution at 65° C. or 75° C. and subjected to the "etching speed" test under the same conditions as in Example 1.

After completion of etching of this resin layer 42, resin layer 42 was washed, resist layer 45 and carrier film 33 were separated and resin layer 42 was completely imidated under the same conditions as in Example 1, and the resulting resin layer 43 was subjected to the "appearance evaluation" test under the same conditions as in Example 1.

The results of these "etching speed" and "appearance evaluation" tests with etching solutions at different temperatures are shown as Examples 6, 7 in Table 1 above.

EXAMPLES 8–10

Precursor layer 41 in the state shown in FIG. 1(b) was calcined twice under the same conditions as in Examples 3–5 and a patterned resist layer 45 was formed on the surface of the resulting resin layer 42 by the same process as in Example 1.

Resin layer 42 in this state was immersed in the same etching solution as in Examples 6 and 7 at 65° C., 75° C. or 85° C. and subjected to the "etching speed" test under the same conditions as in Example 1.

After completion of etching of resin layer 42, the resin layer was washed, resist layer 45 and carrier film 33 were separated and resin layer 42 was completely imidated under the same conditions as in Example 1, and the resulting resin layer 43 was subjected to the "appearance evaluation" test under the same conditions as in Example 1.

The results of these "etching speed" and "appearance evaluation" tests with etching solutions at different temperatures are shown as Examples 8–10 in Table 1 above.

COMPARATIVE EXAMPLES 1, 2

The precursor layer in the state shown in FIG. 1(b) was calcined twice under the same conditions as in Examples 3–5 and further subjected to a third calcination at 350° C. for 15 minutes, and the imidation degree of the resulting resin layer determined under the same conditions as in Example 1 was about 100%. The film thickness of the resin layer was about 17 μm.

A patterned resist layer was formed on the surface of the resin layer in this state by the same process as in Example 1, and then the resin layer was immersed in each of two etching solutions at 85° C. (comparative example 1 was done in the same etching solution as in Examples 1–5 while comparative example 2 used the same etching solution as in Examples 6–10) and both were subjected to the "etching speed" test under the same conditions as in Example 1.

After completion of etching, the resin layer was washed, the resist layer and the carrier film were separated and the resin layer was completely imidated under the same conditions as in Example 1, and the resulting resin layer was subjected to the "appearance evaluation" test under the same conditions as in Example 1.

The results of these "etching speed" and "appearance evaluation" tests with two etching solutions are shown as Comparative examples 1, 2 in Table 1 above.

COMPARATIVE EXAMPLE 3

An etching solution was prepared in the same manner as in Example 1 except that ethylene glycol was used as an alcohol in place of 1,3-propanediol used in Example 1 and mixed with the same water and potassium hydroxide in the same weight ratio as used in Example 1.

Then, the precursor layer in the state shown in FIG. 1(b) was calcined twice under the same conditions as in Examples 3–5 and a patterned resist layer was formed on the surface of the resulting resin layer by the same process as in Example 1.

The resin layer in this state was immersed in said etching solution at 75° C. and subjected to the "etching speed" test under the same conditions as in Example 1.

After completion of etching, the resin layer was washed, the resist layer and the carrier film were separated and the resin layer was completely imidated under the same conditions as in Example 1, and the resulting resin layer was subjected to the "appearance evaluation" test under the same conditions as in Example 1.

The results of these "etching speed" and "appearance evaluation" tests are shown as Comparative example 3 in Table 1 above.

COMPARATIVE EXAMPLE 4

The precursor layer in the state shown in FIG. 1(b) was calcined three times under the same conditions as in Comparative examples 1, 2 and a patterned resist layer was formed on the surface of the resulting resin layer by the same process as in Example 1.

The resin layer in this state was immersed in the same etching solution as in Comparative example 3 at 85° C. and subjected to the "etching speed" test under the same conditions as in Example 1.

After completion of etching, the resin layer was washed, the resist layer and the carrier film were separated and the resin layer was completely imidated under the same conditions as in Example 1, and the resulting resin layer subjected to the "appearance evaluation" test under the same conditions as in Example 1.

The results of these "etching speed" and "appearance evaluation" tests are shown as Comparative example 4 in Table 1 above.

As shown in Table 1 above, Examples 1–5 and Examples 6–10 using a diol as an alcohol required a period of 10 minutes or less for etching a resin layer calcined once or twice (resin layers 42 having a polyimide at an imidation degree in a range of 60–85%) (etching speed) and showed good appearance.

Is Especially, Examples 2, 4, 5, 7, 9 and 10 using an etching solution at 75° C. or more required a period of less than 5 minutes for etching.

Even when an etching solution containing said diol was used, a period of 10 minutes or more was required for etching a resin layer calcined three times (imidation degree of about 100%) as in Comparative examples 1, 2.

In Comparative examples 3 using an etching solution containing ethylene glycol, the imidation degree was about 80% so that a period of 5 minutes or more was required for etching even when the temperature of the etching solution was 75° C. or more, and the appearance evaluation result was also poor.

Especially in Comparative example 4 wherein the imidation degree of the polyimide in the resin layer is 100%, the resin layer exposed at the bottom of the opening in the resist layer could not be completely removed even when it was etched with an etching solution at 85° C. for 25 minutes, and the resist layer was separated from the surface of the resin layer before the resin layer was removed.

Resin layers 43 in the state shown in FIG. 1(*h*) obtained in Examples 2, 4 above were further subjected to "impurity ion analysis" by the method shown below.

[Impurity Ion Analysis]

Resin layers 43 completely imidated in Examples 2, 4 above were measured for the contents (ppm) of chlorine ion, ammonium ion and potassium ion per 1 g of each resin layer 43 by ion exchange chromatography. These measurement results are shown in Table 2 below.

TABLE 2

Results of impurity ion analysis

|  | Imidation degree | Chlorine ion (ppm) | Ammonium ion (ppm) | Potassium ion (ppm) |
|---|---|---|---|---|
| Example 2 | 60% | 3.2 | 3.5 | 0.3 |
| Example 4 | 80% | 2.1 | 3.1 | 0.1 |
| Comparative example 14 | about 15% | 28.8 | 8.1 | 0.4 |

COMPARATIVE EXAMPLE 14

The same resist layer as in Example 1 was formed on the surface of the precursor layer before calcination in the state shown in FIG. 1(*b*), and this resist layer was patterned by the process of Example 1. The substrate in this state was etched by immersing it in an etching solution (a 2 wt % aqueous tetramethylammonium hydroxide solution) at 40° C. under the same conditions as in Example 1.

After completion of etching, the precursor layer was washed, the resist layer and carrier film were separated and the precursor layer was completely imidated under the same conditions as in Example 1 to give a resin layer. The resin layer in this state was subjected to "impurity ion analysis" under the same conditions as in Examples 2, 4. The results are shown in Table 2 above.

As shown in Table 2 above, Examples 2, 4 using an etching solution containing 1,3-propanediol had low contents of all of remaining impurity ions such as chlorine ion, ammonium ion and potassium ion, confirming that etching solutions of the present invention even containing potassium hydroxide cause no contamination by potassium ion.

Comparative example 14 which uses a tetramethylammonium hydroxide solution for etching the precursor layer before imidation, contained high levels of all of the impurity ions.

This result may be seen because the precursor layer has a low imidation degree and a high polyamic acid content and the etching solution does not contain a diol (which protects the polar group of the polyamic acid) so that much of these impurity ions become bound to the polar group of the polyamic acid during etching.

EXAMPLES 11–20

Any one of 1,3-propanediol used in Examples 1–5, 1,4-butanediol used in Examples 6–10 or other types of diols than said diols (2,3-butanediol and 1,5-pentanediol), and the water and potassium hydroxide used in Example 1 were mixed in the ratios shown in Table 3 below to prepare 10 etching solutions.

Then, a resist layer 45 patterned under the same conditions as in Example 1 was formed on the surface of the same resin layer 42 as used in Examples 3, 4 and 8–10 having an imidation degree of 80%.

These resin layers 42 were immersed in each of said 10 etching solutions at 75° C. and subjected to the "etching speed" test under the same conditions as in Example 1.

After completion of etching, resin layer 42 was washed, resist layer 45 and carrier film 33 were separated and resin layer 42 was completely imidated under the same conditions as in Example 1, and the resulting resin layer 43 was subjected to the "appearance evaluation" test under the same conditions as in Example 1.

The results of these "etching speed" and "appearance evaluation" tests with 10 etching solutions are shown as Examples 11–20 in Table 3 below.

COMPARATIVE EXAMPLES 5–13

TABLE 3

Effects of solvent type and mixing ratio on etching performance

|  | Solvent | Mixing ratio (% by weight) | | | | Etching | |
|---|---|---|---|---|---|---|---|
|  |  | Solvent | Water | KOH | Water/KOH | speed (min.) | Appearance |
| Example 11 | 1,4-Butanediol | 3 | 46 | 51 | 0.90 | 5.0 | good |
| Example 12 |  | 57 | 22 | 21 | 1.05 | 4.5 | good |
| Example 13 |  | 51 | 34 | 15 | 2.27 | 4.0 | good |
| Example 14 | 1,3-Propanediol | 15 | 40 | 45 | 0.89 | 4.1 | good |
| Example 15 |  | 51 | 25 | 24 | 1.04 | 4.7 | good |
| Example 16 | 2,3-Butanediol | 15 | 40 | 45 | 0.89 | 4.5 | good |
| Example 17 |  | 33 | 34 | 33 | 1.04 | 4.0 | good |
| Example 18 | 1,5-Pentanediol | 13 | 50 | 37 | 1.35 | 4.9 | good |
| Example 19 |  | 31 | 38 | 31 | 1.23 | 5.0 | good |
| Example 20 |  | 51 | 25 | 24 | 1.04 | 5.7 | good |

TABLE 3-continued

Effects of solvent type and mixing ratio on etching performance

| | Solvent | Mixing ratio (% by weight) | | | | Etching | |
|---|---|---|---|---|---|---|---|
| | | Solvent | Water | KOH | Water/KOH | speed (min.) | Appearance |
| Comparative example 5 | 1,4-Butanediol | 3 | 82 | 15 | 5.47 | 10.5 | poor |
| Comparative example 6 | | 3 | 76 | 21 | 3.62 | 7.0 | poor |
| Comparative example 7 | | 3 | 40 | 57 | 0.70 | >20 | N. A. |
| Comparative example 8 | | 39 | 22 | 39 | 0.56 | >20 | N. A. |
| Comparative example 9 | | 51 | 16 | 33 | 0.48 | >20 | N. A. |
| Comparative example 10 | | 69 | 10 | 21 | 0.48 | >20 | N.A. |
| Comparative example 11 | | 0 | 47 | 53 | 0.89 | 7.8 | poor |
| Comparative example 12 | | 69 | 16 | 15 | 1.07 | 8.0 | poor |
| Comparative example 13 | | 65 | 26 | 9 | 2.89 | 8.0 | poor |

The same alcohol (1,4-butanediol), water and potassium hydroxide as used in Examples 6–10 were mixed in the ratios (% by weight) shown in Table 3 above to prepare 9 etching solutions.

Then, a resist layer patterned under the same conditions as in Example 1 was formed on the surface of the same resin layer as used in Examples 3, 4 and 8–10 having an imidation degree of 80%. The resin layer in this state was immersed in each of said 9 etching solutions at 75° C. and subjected to the "etching speed" test under the same conditions as in Example 1.

After completion of etching, the resin layer was washed, the resist layer and the carrier film were separated and the resin layer was completely imidated under the same conditions as in Example 1, and the resulting resin layer was subjected to the "appearance evaluation" test under the same conditions as in Example 1.

The results of these "etching speed" and "appearance evaluation" tests with 9 etching solutions are shown as Comparative examples 5–13 in Table 3 above.

As shown in Table 3 above, etching speed was less than 6 minutes and opening 49 in etched resin layer 43 showed a good shape when etching solutions of Examples 11–20 were used.

In Comparative examples 5 and 6 using an etching solution containing water in an amount (weight) of three times or more the amount (weight) of potassium hydroxide, however, etching speed was 7 minutes or more and the opening formed by etching had an undulated edge.

In Comparative examples 7–10 using an etching solution containing water in an amount (weight) of 0.7 times or less the amount (weight) of potassium hydroxide, the resist layer (which occured separated when the etching period passed 20 minutes before the resin layer was completely removed and etching could not be completed).

In Comparative example 11 using an etching solution containing no alcohol, not only etching speed was low but also the shape of the etched pattern was poor.

In Comparative examples 12 and 13 using an etching solution containing 65% by weight or more of an alcohol, etching speed was lower than Comparative example 11.

Next, a process for manufacturing another example of flexible wiring board of the present invention is explained with reference to FIG. 2(a)–2(f).

EXAMPLE

Figure 2A:
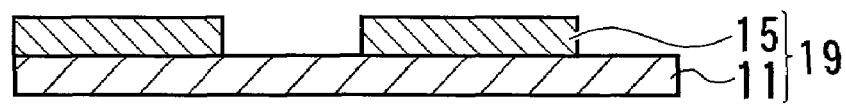
FIG. 2(a)–(g) is a flow sheet illustrating a process for manufacturing a second example of flexible wiring board of the present invention.

In a second embodiment, reference numeral 19 in FIG. 2(a) represents a substrate having a base film 11 and a metal wiring 15 provided on the surface of base film 11.

Figure 2B:
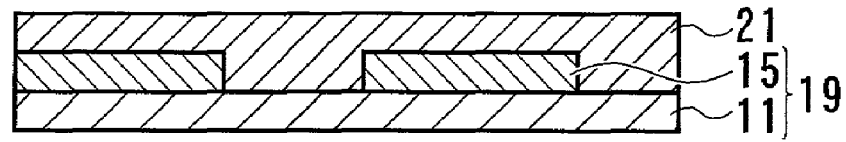

On the side of substrate 19 on which metal wiring 15 is provided, a polyamic acid coating solution is initially applied and heated to dryness in a drying oven at 100° C. for 4 minutes to form a layer of a polyimide precursor (polyamic acid). Reference numeral 21 in FIG. 2(b) represents thus formed precursor layer.

Then, the assembly is further heated at 160° C. for 3 minutes to imidate the polyamic acid contained in precursor layer 21.

Figure 2C:
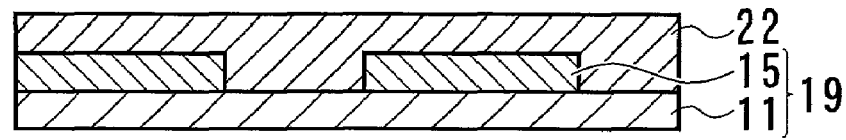

Reference numeral 22 in FIG. 2(c) represents a resin layer obtained by imidating precursor layer 21, and the imidation degree of the polyimide contained in this resin layer 22 is in the range of 50–98%.

Figure 2D:
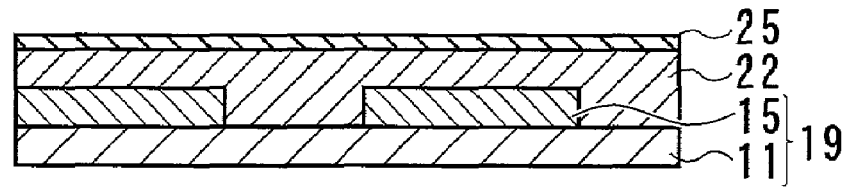

Then, a resist layer coating solution is applied and dried on the surface of resin layer 22 in this state to form a resist layer 25 (FIG. 2(d)). Then, this resist layer 25 is patterned by exposure and development.

Figure 2E:
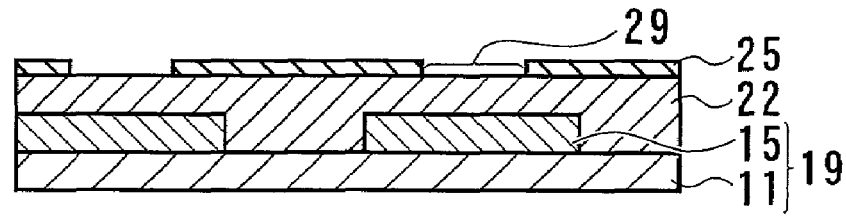

Reference numeral 29 in FIG. 2(e) represents an opening formed in resist layer 25 by patterning, and resin layer 22 is exposed at the bottom of this opening 29.

Then, the same etching solution as used in Example 1 above is warmed to at least 65° C., and resin layer 22 in the state shown in FIG. 2(e) is wholly immersed in the etching solution at 65° C. or more with gentle stirring to remove resin layer 22 exposed at the bottom of opening 29 (etching).

When resin layer 22 at the bottom of opening 29 is completely removed and the surface of metal wiring 15 is exposed at the bottom of opening 29, the assembly is removed from the etching solution and the etching solution is washed off the assembly with warm water at 60° C. to complete etching.

Figure 2F:
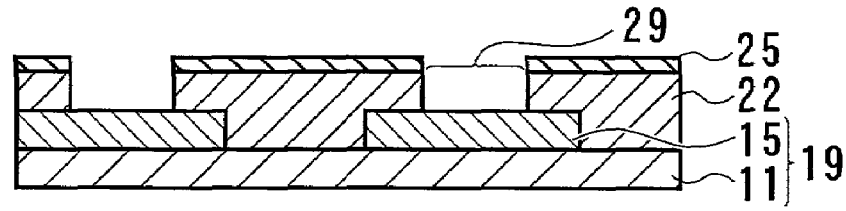

FIG. 2(f) shows the state in which etching has been completed and opening 29 is formed in resin layer 22 and metal wiring 15 is exposed at the bottom of opening 29.

Figure 2G:
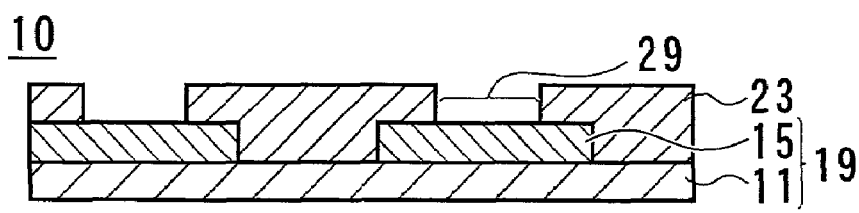
Figure 3A:
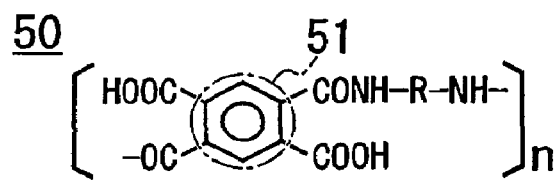
FIG. 3 (a), (b) illustrates the structure of polyimide and polyimidic acid.
Figure 3B:
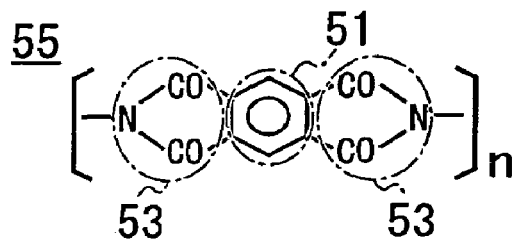

Then, resist layer 25 is separated and the assembly is heated at 350° C. for 15 minutes to completely imidate the polyimide in resin layer 22 into a second example of flexible wiring board as shown by reference numeral 10 in FIG. 2(g).

Next, a process for connecting a flexible wiring board 10, 30 of the present invention to another flexible wiring board is explained.

Figure 4A:
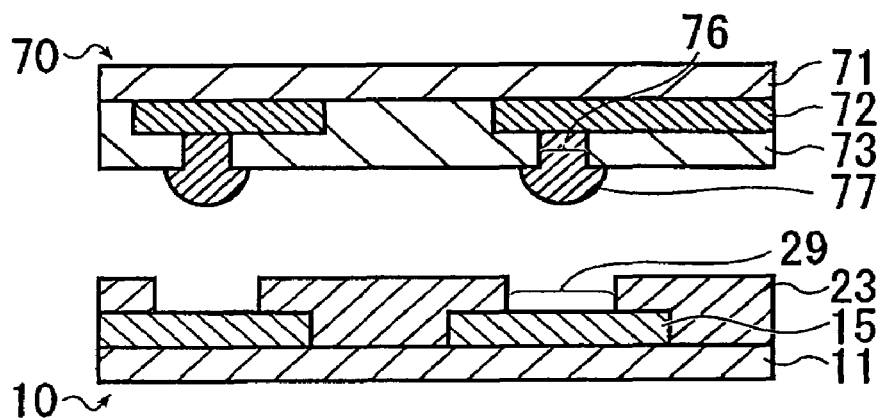
FIG. 4(a), (b) is a flow sheet illustrating a process for manufacturing an example of flexible wiring board of multilayer structure using a flexible wiring board of the present invention.

Reference numeral 70 in FIG. 4(a) represents another flexible wiring board which may be laminated to a flexible wiring board 10 of the present invention. This flexible wiring board 70 has a base film 71, a metal wiring 72 provided on the surface of base film 71, and a cover film 73 provided on the side of base film 71 on which metal wiring 72 is provided.

Cover film 73 has openings 76 at positions where metal wiring 72 is located. Bumps 77 formed to stand in perpendicular direction on the surface of metal wiring 72 are received in openings 76 in cover film 73, with the tops of bumps 77 projecting over the surface of cover film 73.

In order to connect this flexible wiring board 70 to a flexible wiring board shown by reference numeral 10, resin layer 23 of flexible wiring board 10 and cover film 73 of another flexible wiring board 70 are faced each other so that openings 29 in resin layer 23 are aligned with bumps 77 projecting over the surface of cover film 73.

Figure 4B:
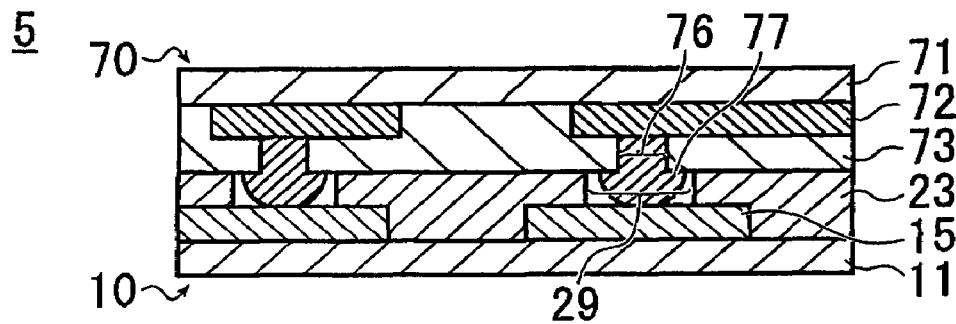

Then, flexible wiring board 70 is pressed against flexible wiring board 10 of the present invention so that the tops of bumps 77 come into contact with metal wiring 15 via openings 29 in resin layer 23 (FIG. 4(b)).

Cover film 73 of flexible wiring board 70 consists of a resin developing adhesiveness upon heating so that flexible wiring board 70 in the state shown in FIG. 4(b) is heated under pressure to mechanically connect two flexible wiring boards 10, 70 via cover film 73.

Reference numeral 5 in FIG. 4(b) represents a flexible wiring board of multilayer structure consisting of mechanically connected flexible wiring boards 10, 70, and these flexible wiring boards 10, 70 are electrically connected via bumps 77.

Figure 1I:
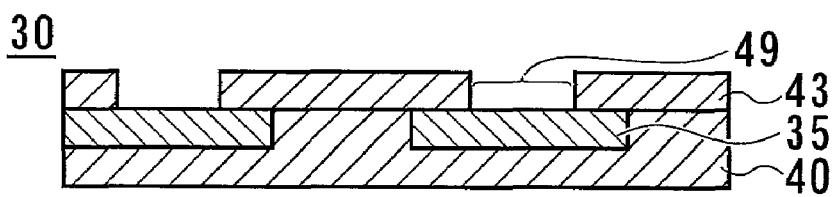
Figure 5:
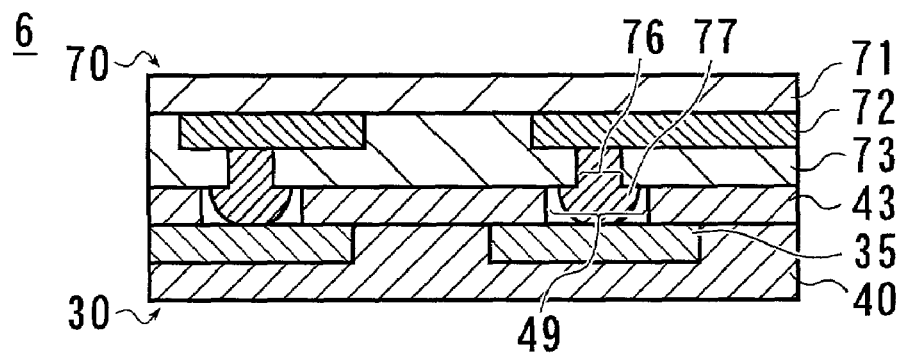
FIG. 5 illustrates an other example of flexible wiring board of multilayer structure.

Although flexible wiring board 10 shown in FIG. 2(g) is used in the foregoing embodiment, the present invention is not limited to this embodiment but a multilayer flexible wiring board as shown by reference numeral 6 in FIG. 5 can also be prepared by connecting a flexible wiring board shown by reference numeral 30 in FIG. 1(i) and a flexible wiring board 70 having bumps 77.

Although metal wiring 15, 35 is exposed at the bottom of opening 29, 49 in resin layer 23, 43 in the foregoing embodiments, the present invention is not limited to these embodiments.

Figure 6:
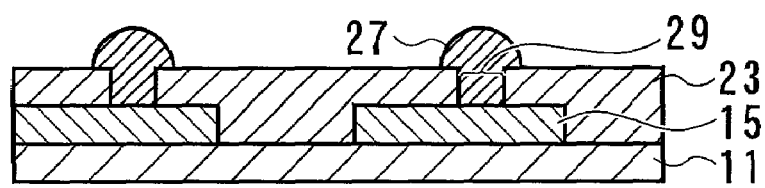
FIG. 6 illustrates a third example of flexible wiring board of the present invention.

Reference numeral 80 in FIG. 6 represents a third example of flexible wiring board of the present invention. This flexible wiring board 80 has the same base film 11, metal wiring 15 and resin layer 23 as those of a flexible wiring board shown by reference numeral 10 in FIG. 2(g). Bumps 27 formed to stand in perpendicular direction on the surface of metal wiring 15 are arranged in openings 29 in resin layer 23, with the tops of bumps 27 projecting over the surface of resin layer 23.

Figure 7:
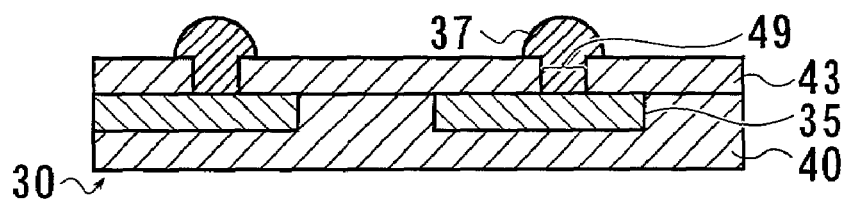
FIG. 7 illustrates a fourth example of flexible wiring board of the present innvention.
Figure 8A:
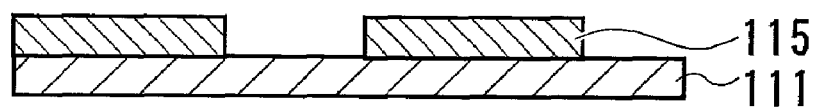
FIG. 8(a)–(e) is a flow sheet illustrating a process for manufacturing a flexible wiring board of the prior art.
Figure 8B:
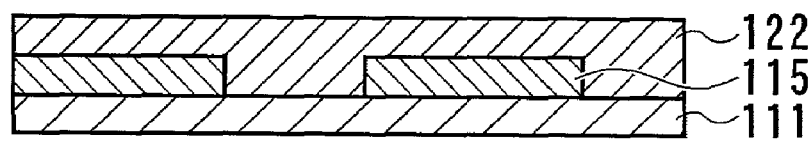
Figure 8C:
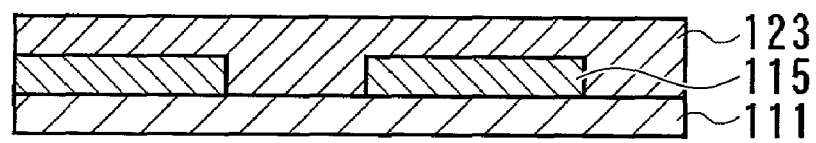
Figure 8D:
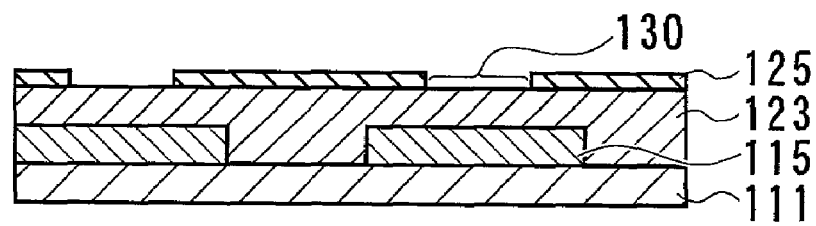
Figure 8E:
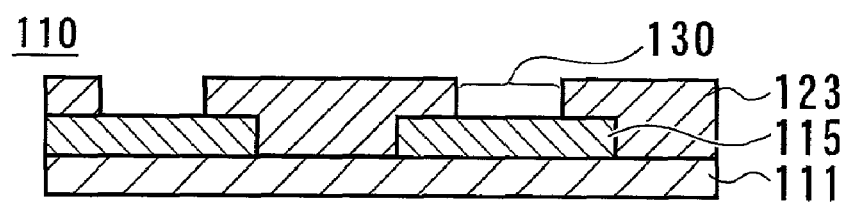

Reference numeral 90 in FIG. 7 represents a fourth example of flexible wiring board of the present invention, which has the same base film 40, metal wiring 35 and resin layer 43 as those of a flexible wiring board shown by reference numeral 30 in FIG. 1(i). Similarly to said third example of flexible wiring board 80, bumps 47 are received in openings 49 in resin layer 43.

Although an alkali metal hydroxide consisting of potassium hydroxide is used as an alkali compound in the foregoing embodiments, the present invention is not limited to these embodiments, but sodium hydroxide can also be used, for example.

When a less water-soluble compound such as lithium hydroxide is used, it is preferably used in combination with a highly water-soluble compound such as potassium hydroxide or sodium hydroxide.

Organic alkali compounds such as quaternary ammonium hydroxide can also be used, especially commercially readily available aqueous solutions of tetramethylammonium hydroxide, tetraethylammonium hydroxide or the like. However, these aqueous quaternary ammonium hydroxide solutions are normally commercially available as low concentration aqueous solutions at 25% by weight or less so that these solutions are not desirable for etching solutions of the present invention (alkali compound:water=1:0.75–3.0) because the water content becomes 4 times or more the content of the alkali compound, quaternary ammonium hydroxide.

Therefore, commercially available aqueous quaternary ammonium hydroxide solutions are preferably concentrated in advance to a quaternary ammonium hydroxide content of 34% by weight or more using a rotary evaporator or the like and then used for etching solutions of the present invention.

When such an organic alkali compound is used in combination with an inorganic alkali compound such as potassium hydroxide, etching speed can be synergistically increased.

In the present invention, etching solutions having a high etching speed can be obtained when the amount (weight) of water is in the range of 0.75–3.0 times, more preferably 0.85–2.5 times the amount of the alkali compound.

As defined above, etching solutions of the present invention contain water in a range of 0.75–3 times the amount of the alkali compound. When the alkali compound is present at said mixing ratio, polyimides having an imidation degree of 50% or more can be rapidly etched without adding an amine into the etching solution.

Even when the alkali compound is contained at 55% by weight based on the total weight of etching solution, for example, etching solutions of the present invention may contain a minimum amount of water (0.75 times or more of the alkali compound and 41.25% by weight of the total weight of etching solution) because they may contain 3% by weight or more of an alcohol based on the total weight of etching solution.

Etching solutions of the present invention containing either one or both of a diol containing 3 to 6 carbon atoms and a triol containing 4 to 6 carbon atoms as an alcohol can be used even at a high temperature of 75° C. or more to safely perform etching operation because said alcohol containing 2 or less of carbon atoms has a higher flash point than lower alcohols.

Resin layers containing a polyamic acid can be etched without being contaminated with impurity ions such as ammonium ion or potassium ion even when they are contained in etching solutions because said alcohol prevents unnecessary ions from binding the polar group of the polyamic acid.

Said etching solutions can be used to etch a resin layer having an imidation degree of 50% or more without deforming the pattern of the opening in the final resin layer because the degree of shrink of the resin layer caused by complete imidation after etching is reduced by half as compared with the degree of shrink obtained with an imidation degree of 15% or less.

Etching solutions of the present invention can be used for etching at 65° C. or more, more preferably 75° C. or more with a shortened etching period.

After completion of etching of a resin layer, the resin layer can be heated to completely imidate the polyimide in the resin layer.

When a resin layer having an imidation degree of more than 90% is to be etched, it may not be completely imidated after etching but should preferably be completely imidated in order to prepare a more reliable flexible wiring board.

However, an optimal etching period desirably stretches over a range because too high etching speed causes overetching.

The mixing ratio of the alkali compound to water should be determined within the range defined above with due consideration for the fact that the finishing appearance after etching is not always proportional to etching speed.

Various classes of alcohol can be used in the present invention so far as they belong to diols containing 3 to 6 carbon atoms or triols containing 4 to 6 carbon atoms. For example, diols containing less than 2 carbon atoms such as ethylene glycol or triols containing less than 3 carbon atoms such as glycerin are not suitable for etching solutions of the present invention because of the low etching speed.

Etching solutions using a diol or triol containing more than 6 carbon atoms as an alcohol have a lower etching speed as compared with etching solutions of the present invention.

Alcohols containing more than 6 carbon atoms are not suitable for etching solutions of the present invention because they have a low solubility for water to result in etching solutions with low dispersibility.

The amount of an alcohol used in the present invention is in the range of 3–65% by weight, but may be in the range of 5–55% by weight to further increase etching speed.

However, etching precision and the appearance after etching are influenced by resist layer 25 and the type and amount of the alcohol used, so that the type and amount of the alcohol should be determined with consideration for the type of resist layer 25 used for etching and the etching precision required.

The type of the polyimide that can be used in the present invention is not specifically limited, either, but various types can be used.

Although precursor layer 21, 41 is initially formed and then imidated into resin layer 22, 42 in the foregoing embodiments, the present invention is not limited to these embodiments.

For example, a polyamic acid may be imidated to an imidation degree of 50–98% during the synthesis, and the polyimide in this state may be dissolved in a solvent and then applied and dried on the surface of metal foil 31 or metal wiring 15 to directly form an imidated resin layer.

In this case, the process is simplified by omitting imidation (heating) before etching, but suitable polyimides are limited to the solvent-soluble type.

Although a test piece is wholly immersed in an etching solution to etch resin layer 22, 42 in the foregoing embodiments, the present invention is not limited to these embodiments. For example, an etching solution of the present invention may be sprayed on the face having resist layer 25, 45 to etch resin layer 22, 42.

According to the present invention, resin layers can be rapidly and precisely etched without using an amine or a lower alcohol.

While the invention has been described with respect to a limited number of embodiments, those skilled in the art, having benefit of this disclosure, will appreciate that other embodiments can be devised which do not depart from the scope of the invention as described herein. Accordingly, the scope of the invention should be limited only by the attached claims.

What is claimed is:

1. A method for etching a resin layer, comprising:
forming a film-like resin layer based on a polyimide having an imidation degree of from 50 to 98%;
providing a resist layer having an opening at a position on a surface of the resin layer;
bringing an etching solution at 65° C. or more into contact with the resin layer located at a bottom of the opening to etch the resin layer, wherein the etching solution comprises 3 to 65% by weight alcohol, 10 to 55% by weight alkali compound, and water in a weight of 0.75 to 3.0 times a weight of the alkali compound, and wherein the alcohol comprises at least one selected from the group consisting of a diol containing from 3 to 6 carbon atoms and a triol containing from 4 to 6 carbon atoms, and wherein the alkali compound comprises at least one selected from the group consisting of an alkali metal hydroxide and a quaternary ammonium hydroxide;
then separating the resist layer from the resin layer; and imidating the polyimide of the resin layer.

2. A method for etching a resin layer, comprising:
forming a film-like resin layer based on a polyimide having an imidation degree of from 50 to 98%;
providing a resist layer having an opening at a position on the surface of the resin layer;
bringing an etching solution at 65° C. or more into contact with the resin layer located at a bottom of the opening to etch the resin layer, wherein the etching solution comprises 3 to 65% by weight alcohol, 10 to 55% by weight alkali compound, and water in a weight of from 0.85 to 2.5 times the weight of the alkali compound and wherein the alcohol comprises at least one selected from the group consisting of a diol containing from 3 to 6 carbon atoms and a triol containing from 4 to 6 carbon atoms and wherein the alkali compound comprises at least one selected from the group consisting of an alkali metal hydroxide and a quaternary ammonium hydroxide;
then separating the resist layer from the resin layer; and imidating the polyimide of the resin layer.

3. The method of claim 1, wherein forming a film-like resin layer comprises heating a precursor layer based on a polyimide resin having an imidation degree of less than 50%.

4. The method of claim 2, wherein forming a film-like resin layer comprises heating a precursor layer based on a polyimide resin having an imidation degree of less than 50%.

5. The method of claim 1 wherein forming a film-like resin layer comprises:
applying a coating solution; and
drying the coating solution containing a polyimide having an imidation degree of from 50 to 98% on a substrate.

6. The method of claim 2, wherein forming a film-like resin layer comprises:
applying a coating solution; and
drying the coating solution containing a polyimide having an imidation degree of from 50 to 98% on a substrate.

7. A method for manufacturing a flexible wiring board comprising:
applying a coating solution containing a polyimide precursor on a side of a substrate having at least a metal wiring on which the metal wiring is provided;
drying the coating solution to form a precursor layer based on a polyimide having an imidation degree of less than 50%;
heating the precursor layer to form a polyimide resin layer having an imidation degree of from 50 to 98%;
applying a resist layer coating solution on a surface of the resin layer;
drying the resist layer coating solution to form a resist layer;
patterning the resist layer in a shape to form an opening;
preparing an etching solution comprising 3 to 65% by weight alcohol, 10 to 55% by weight alkali compound, and water in a weight of from 0.75 to 3.0 times a weight of the alkali compound and wherein the alcohol comprises at least one selected from the group consisting of a diol containing from 3 to 6 carbon atoms and a triol containing from 4 to 6 carbon atoms and wherein the alkali compound comprises at least one selected from the group consisting of an alkali metal hydroxide and a quaternary ammonium hydroxide;
bringing the etching solution at 65° C. or more into contact with the resin layer located at a bottom of the opening to etch the resin layer;
then separating the resist layer from the resin layer; and
imidating the polyimide of the resin layer.

8. A method for manufacturing a flexible wiring board comprising:
applying a coating solution containing a polyimide precursor on a surface of a metal foil;
drying the coating solution to form a precursor layer based on a polyimide having an imidation degree of less than 50%;
heating the precursor layer to form a polyimide resin layer having an imidation degree of from 50 to 98%;
applying a resist layer coating solution on the surface of the resin layer;
drying the resist layer coating solution to form a resist layer;
patterning the resist layer in a shape to form an opening;
preparing an etching solution comprising 3 to 65% by weight alcohol, 10 to 55% by weight alkali compound, and water in a weight of from 0.75 to 3.0 times the weight of the alkali compound, and wherein the alcohol comprises at least one selected from the group consisting of a diol containing from 3 to 6 carbon atoms and a triol containing from 4 to 6 carbon atoms and wherein the alkali compound comprises at least one selected from the group consisting of an alkali metal hydroxide and a quaternary ammonium hydroxide;
bringing the etching solution at 65° C. or more into contact with the resin layer located at a bottom of the opening to etch the resin layer;
providing a resist layer having an opening at a position on the opposite side to a side of the metal foil on which the resin layer is formed to remove the metal foil exposed at the bottom of the opening in the resist layer;
then separating the resist layer from the resin layer; and
imidating the polyimide of the resin layer.

9. A method for manufacturing a flexible wiring board comprising:
applying a coating solution containing a polyimide having an imidation degree of from 50 to 98% on the side of a substrate having at least a metal wiring on which the metal wiring is provided;
drying the coating solution to form a resin layer;
applying a resist layer coating solution on a surface of the resin layer;
drying the resist layer coating solution to form a resist layer;
patterning the resist layer in a shape to form an opening;
preparing an etching solution comprising 3 to 65% by weight of alcohol, 10 to 55% by weight of alkali compound, and water in a weight of from 0.75 to 3.0 times a weight of the alkali compound, wherein the alcohol comprises at least one selected from the group consisting of a diol containing from 3 to 6 carbon atoms and a triol containing from 4 to 6 carbon atoms and wherein the alkali compound comprises at least one selected from the group consisting of an alkali metal hydroxide and a quaternary ammonium hydroxide; and
bringing the etching solution at 65° C. or more into contact with the resin layer located at a bottom of the opening to etch the resin layer;
then separating the resist layer from the resin layer; and
imidating the polyimide of the resin layer.

10. A method for manufacturing a flexible wiring board comprising:
applying a coating solution containing a polyimide having an imidation degree of from 50 to 98% on a surface of a metal foil;
drying the coating solution to form a resin layer;
applying a resist layer coating solution on a surface of the resin layer;
drying the resist layer coating solution to form a resist layer;
patterning the resist layer in a shape to form an opening;
preparing an etching solution comprising 3 to 65% by weight alcohol, 10 to 55% by weight alkali compound, and water in a weight of from 0.75 to 3.0 times a weight of the alkali compound wherein the alcohol comprises at least one selected from the group consisting of a diol containing from 3 to 6 carbon atoms and a triol containing from 4 to 6 carbon atoms and wherein the alkali compound comprises at least one selected from the group consisting of an alkali metal hydroxide and a quaternary ammonium hydroxide;
bringing the etching solution at 65° C. or more into contact with the resin layer located at the bottom of the opening to etch the resin layer;
providing a resist layer having an opening at a position on the opposite side to a side of the metal foil on which the resin layer is formed to remove the metal foil exposed at a bottom of the opening in the resist layer;
then separating the resist layer from the resin layer; and
imidating the polyimide of the resin layer.

11. The method of claim 1, wherein the polyimide is synthesized from biphenyltetracarboxylic acid and aromatic diamine.

12. The method of claim 2, wherein the polyimide is synthesized from biphenyltetracarboxylic acid and aromatic diamine.

13. The method of claim 7, wherein the polyimide is synthesized from biphenyltetracarboxylic acid and aromatic diamine.

14. The method of claim 7, wherein bringing the etching solution comprises removing the resin layer so as to expose the metal wiring at the bottom of the opening.

15. The method of claim 8, wherein the polyimide is synthesized from biphenyltetracarboxylic acid and aromatic diamine.

16. The method of claim 8, wherein brining the etching solution comprises removing the resin layer so as to expose the metal foil at the bottom of the opening.

17. The method of claim 9, wherein the polyimide is synthesized from biphenyltetracarboxylic acid and aromatic diamine.

18. The method of claim 9, wherein brining the etching solution comprises removing the resin layer so as to expose the metal wiring at the bottom of the opening.

19. The method of claim 10, wherein the polyimide is synthesized from biphenyltetracarboxylic acid and aromatic diamine.

20. The method of claim 10, wherein brining the etching solution comprises removing the resin layer so as to expose the metal wiring at the bottom of the opening.

* * * * *